United States Patent [19]
Chilton et al.

[11] Patent Number: 5,819,065
[45] Date of Patent: Oct. 6, 1998

[54] SYSTEM AND METHOD FOR EMULATING MEMORY

[75] Inventors: John E. Chilton, Soquel; Tony R. Sarno, Scotts Valley; Ingo Schaefer, Sunnyvale, all of Calif.

[73] Assignee: Quickturn Design Systems, Inc., Mountain View, Calif.

[21] Appl. No.: 597,197

[22] Filed: Feb. 6, 1996

Related U.S. Application Data

[63] Continuation-in-part of Ser. No. 496,239, Jun. 28, 1995.
[51] Int. Cl.[6] ..................................................... G06F 9/455
[52] U.S. Cl. ................... 395/500; 395/189.04; 364/488; 364/578
[58] Field of Search .................................... 395/500, 920, 395/183.05, 189.04; 371/16.2, 22.2, 22.4; 364/488, 489, 490, 491, 578

[56] References Cited

U.S. PATENT DOCUMENTS

| | | | |
|---|---|---|---|
| 3,955,180 | 5/1976 | Hirtle | 340/172.5 |
| 4,277,827 | 7/1981 | Carlson et al. | 395/500 |
| 4,306,286 | 12/1981 | Cocke et al. | 364/200 |
| 4,357,678 | 11/1982 | Davis | 364/900 |
| 4,527,249 | 7/1985 | Van Brunt | 364/578 |
| 4,583,169 | 4/1986 | Cooledge | 395/500 |
| 4,587,625 | 5/1986 | Marino et al. | 364/578 |

(List continued on next page.)

OTHER PUBLICATIONS

SimExpress Specifications, Mentor Graphic, SimExpress™ Hardware Emulator.

Maliniak, Lisa, "Pin Multiplexing Yields Low–Cost Logic Emualtion", Electronic Design, Jan. 22, 1996.

Goering, R., "Emulation for the masses", Electronic Engineering Times, Jan. 29, 1996, p. 63.

Agarwal, Anant, "Virtual Wires™: a Technology for Massive Multi–FPGA Systems," Virtual Machine Works, pp. 1–24.

Agarwal, Anant, "Virtual Wires™: a Technology for Massive Multi–FPGA Systems", Virtual Marchine Works (no publication date given).

"Virtual Wires Published Papers", URL, http:/cag–www.lcs.mit.edu/vwires/papers/index.html, Mar. 26, 1997.

'VHDL Mixed–Levl Fault Simulator, URL, http://www.i-kos.com/products/voyagerfs/index.html, Mar. 26, 1997.

VirtualLogic SLI Emulation System, Virtual Logic SLI:, URL, http://www.ikos.com/products/vlsi, Mar. 26, 1997.

"Logic Emulation for the Masses", URL, http://www.ikos.com/company/news/pr960916.html, Mar. 26, 1997.

"Ikos Systems to Acquire Virtual Machine Works", URL, http://www.ikos.com/company/news/pr960311.html, Mar. 26, 1997.

*Primary Examiner*—Kevin J. Teska
*Assistant Examiner*—Tyrone V. Walker
*Attorney, Agent, or Firm*—Lyon & Lyon LLP

[57] ABSTRACT

A system and method for emulating memory designs is described. The system includes a time sliced logic emulator. The time sliced logic emulator emulates the functions performed in one cycle of a target design by emulating portions of the functions in a set of time slices. That is, a set of time slices represents a single clock cycle in the target design. The system emulates many different types of memory designs included in the target design. The system includes an emulation memory. The memory designs are mapped to the emulation memory via a programmable address generation block. For a given time slice, the programmable address generation block generates an address that maps all or part of a memory design address to an emulation memory address. The programmable address generation block allows multiple memory designs to be mapped to a single emulation memory and allows a single memory design to be mapped to multiple emulation memories. Thus, over multiple time slices, the system can emulate many different types of memories.

8 Claims, 5 Drawing Sheets

U.S. PATENT DOCUMENTS

| | | | |
|---|---|---|---|
| 4,642,759 | 2/1987 | Foster | 395/500 |
| 4,656,580 | 4/1987 | Hitchcock, Sr. et al. | 364/200 |
| 4,695,968 | 9/1987 | Sullivan, II et al. | 364/200 |
| 4,697,241 | 9/1987 | Lavi | 364/488 |
| 4,725,971 | 2/1988 | Doshi et al. | 364/578 |
| 4,769,817 | 9/1988 | Krohn et al. | 371/23 |
| 4,782,461 | 11/1988 | Mick et al. | 364/900 |
| 4,787,061 | 11/1988 | Nei et al. | 364/900 |
| 4,787,062 | 11/1988 | Nei et al. | 364/900 |
| 4,819,150 | 4/1989 | Jennings et al. | 364/200 |
| 4,862,347 | 8/1989 | Rudy | 364/200 |
| 4,868,822 | 9/1989 | Scott et al. | 395/183.05 |
| 4,879,646 | 11/1989 | Iwasaki et al. | 395/183.14 |
| 4,914,612 | 4/1990 | Beece et al. | 364/578 |
| 4,954,942 | 9/1990 | Masuda et al. | 395/500 |
| 4,958,315 | 9/1990 | Balch | 395/500 |
| 4,972,334 | 11/1990 | Yamabe et al. | 364/200 |
| 5,025,364 | 6/1991 | Zellmer | 395/500 |
| 5,031,129 | 7/1991 | Powell et al. | 364/717 |
| 5,036,473 | 7/1991 | Butts et al. | 364/489 |
| 5,068,812 | 11/1991 | Schaefer et al. | 364/578 |
| 5,084,824 | 1/1992 | Lam et al. | 364/490 |
| 5,109,353 | 4/1992 | Sample et al. | 364/578 |
| 5,114,353 | 5/1992 | Sample | 439/65 |
| 5,126,966 | 6/1992 | Hafeman et al. | 364/500 |
| 5,259,006 | 11/1993 | Price et al. | 375/356 |
| 5,291,584 | 3/1994 | Challa et al. | 395/500 |
| 5,321,828 | 6/1994 | Phillips et al. | 395/500 |
| 5,325,365 | 6/1994 | Moore et al. | 395/183.05 |
| 5,329,470 | 7/1994 | Sample et al. | 364/578 |
| 5,329,471 | 7/1994 | Swoboda et al. | 364/578 |
| 5,331,571 | 7/1994 | Aronoff et al. | 364/490 |
| 5,345,580 | 9/1994 | Tamaru et al. | 395/500 |
| 5,352,123 | 10/1994 | Sample et al. | 439/61 |
| 5,377,123 | 12/1994 | Hyman | 364/489 |
| 5,386,550 | 1/1995 | Yumioka et al. | 364/578 |
| 5,396,498 | 3/1995 | Lestral et al. | 371/3 |
| 5,425,036 | 6/1995 | Liu et al. | 371/24 |
| 5,437,037 | 7/1995 | Furuichi | 395/700 |
| 5,448,496 | 9/1995 | Butts et al. | 364/489 |
| 5,448,522 | 9/1995 | Huang | 365/189.04 |
| 5,452,231 | 9/1995 | Butts et al. | 364/489 |
| 5,452,239 | 9/1995 | Dai et al. | 364/578 |
| 5,473,765 | 12/1995 | Gibbons et al. | 395/500 |
| 5,475,624 | 12/1995 | West | 364/578 |
| 5,475,830 | 12/1995 | Chen et al. | 395/500 |
| 5,477,475 | 12/1995 | Sample et al. | 364/578 |
| 5,515,525 | 5/1996 | Grynberg et al. | 395/500 |
| 5,551,013 | 8/1996 | Beausoleil et al. | 395/500 |
| 5,563,829 | 10/1996 | Huang | 395/189.04 |
| 5,572,710 | 11/1996 | Asano et al. | 395/500 |
| 5,640,542 | 6/1997 | Whitsel et al. | 395/500 |

5,819,065

SYSTEM AND METHOD FOR EMULATING MEMORY

RELATED APPLICATION INFORMATION

This application is a continuation-in-part of prior filed U.S. application Ser. No. 08/496,239, entitled EMULATION SYSTEM HAVING MULTIPLE EMULATED CLOCK CYCLES PER EMULATOR CLOCK CYCLE AND IMPROVED SIGNAL ROUTING, filed Jun. 28, 1995, which is incorporated by reference.

THE BACKGROUND OF THE INVENTION a. The Field of the Invention

This invention relates to the field of circuit emulation systems. In particular, the invention relates to a system for emulating memory circuit designs within an emulation system.

b. A Description of the Related Art

As electronic circuit designs continue to increase in speed and complexity, the testing of the developing circuit designs at various stages of development becomes even more critical. Logic emulators test complex circuit designs as the designs develop. Logic emulators can include software configurable hardware which emulates the functions of the circuit design. The circuit design is specified by a data set that describes the function and behavior of the circuit design.

Memory circuit designs are one component of circuit designs that need to be emulated. Circuit designs can include many different types of memory circuit designs, for example, single ported random access memory (RAM), and multi-ported video RAM (VRAM). The size of these memory circuit designs can also vary in height and width. For example, a memory circuit design may have 3072 entries (3K high) while each entry may be twenty-four bits wide. Another memory circuit design may be 128 entries high while each entry may be 128 bits wide.

In previous logic emulators, designers have had to wire up their own working versions of the memory circuit designs. The designer then interfaces the wired up memory circuit to the logic emulator. This is undesirable for a number of reasons. First, a designer cannot simply use the software description of the circuit design directly in the logic emulator because the memory circuit designs must be removed or otherwise disabled. Second, the designer must build the physical memory circuits to interface to the emulator. This is a time consuming, error prone, and costly procedure that limits a designer's ability to easily try new memory circuit designs. Third, the logic emulator must interface directly with the wired up version of the memory circuit design. This adds expense to the logic emulator and ties up hardware interface resources that could be used to interface the logic emulator with other external circuits. U.S. Pat. No. 5,448,522 describes a system supporting multiport memory circuit emulation using tag registers. Multiple copies of the memory array are created in order to implement as many read ports and write ports as the multiport memory circuit being implemented. However, this has a number of disadvantages. For example, because multiple duplications of the memory array are needed, large amounts of memory is used in the emulator. Additionally, writes in one duplicate of a memory array must be tracked and reflected in the other duplicates of the memory array. This requires additional logic to be used in the memory array.

Therefore, what is needed is an improved logic emulator.

A SUMMARY OF THE INVENTION

A system for emulating memory circuit designs is described. The system simultaneously emulates multiple memory circuit designs. The address spaces of the memory circuit designs are mapped to the address space of the system's emulation memory. The address spaces are also mapped across multiple time periods. Thus, the system can emulate memory circuits having multiple ports.

A system and method for emulating memory circuit designs is described. The system includes a time sliced logic emulator. The time sliced logic emulator emulates the functions performed in one cycle of a target design by emulating portions of the functions in a set of time slices. That is, a set of time slices represents a single clock cycle in the target design. The system emulates many different types of memory designs included in the target design. The system includes an emulation memory. The memory designs are mapped to the emulation memory via a programmable address generation block. For a given time slice, the programmable address generation block generates an address that maps all or part of a memory design address to an emulation memory address. The programmable address generation block allows multiple memory designs to be mapped to a single emulation memory and allows a single memory design to be mapped to multiple emulation memories. Thus, over multiple time slices, the system can emulate many different types of memories.

Although many details have been included in the description and the figures, the invention is defined by the scope of the claims. Only limitations found in those claims apply to the invention.

A BRIEF DESCRIPTION OF THE DRAWINGS

The figures illustrate the invention by way of example, and not limitation. Like references indicate similar elements.

THE DESCRIPTION a. An Emulation System

Figure 1:
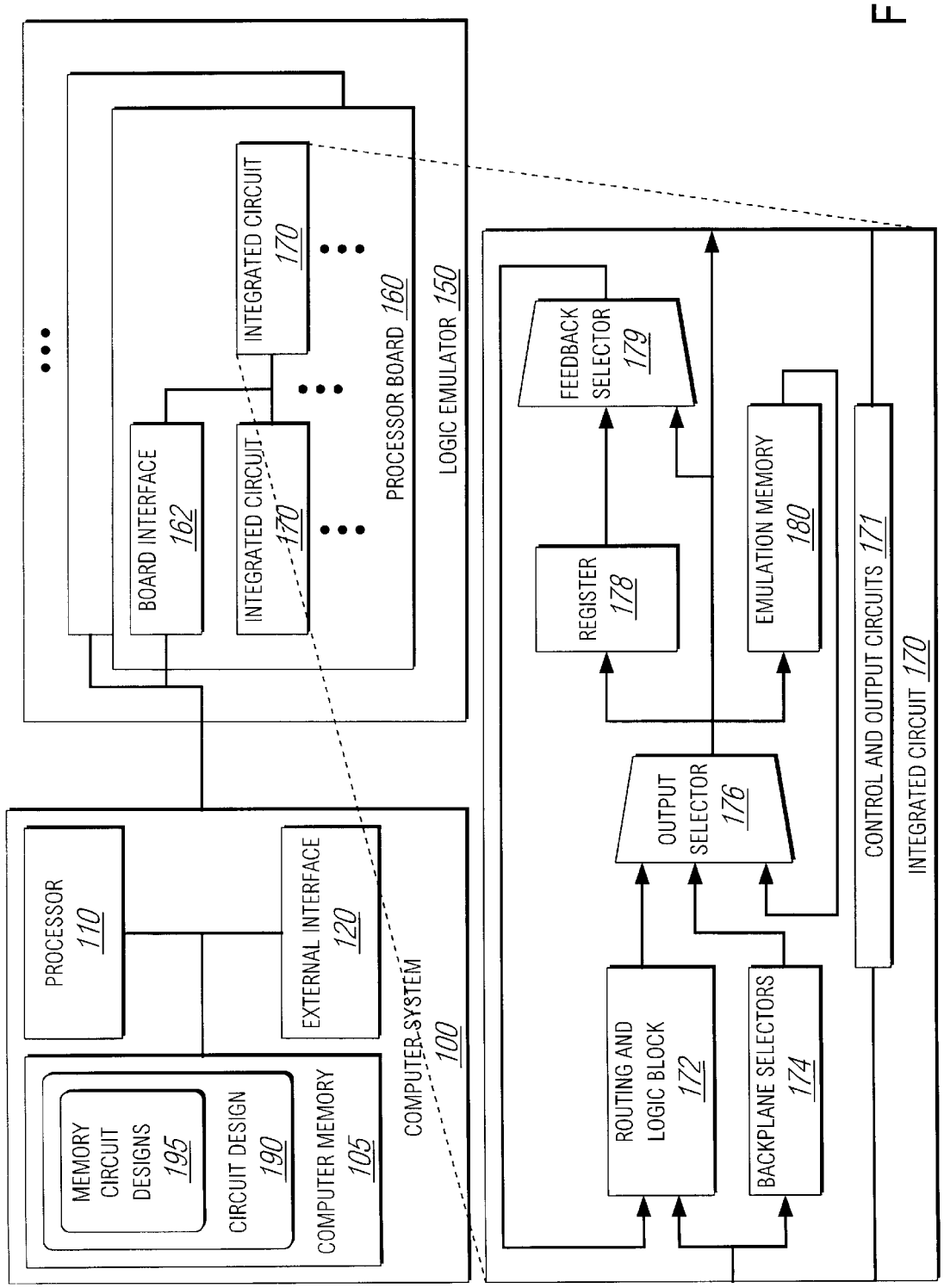
FIG. 1 illustrates an emulation system having emulation memory circuits.

FIG. 1 illustrates an emulation system for emulating circuit designs including different types of memory designs. The emulation system includes a computer system 100 and a logic emulator 150.

The computer system 100 includes a processor 110, a computer memory 105 and an external interface 120 all coupled together. The processor 110 is for executing processes and for controlling the computer memory 105 and the external interface 120. The computer memory 105 stores programs and data. The external interface 120 communicates with the logic emulator 150. The data includes a circuit design 190. The circuit design 190, also known as the target design, represents a circuit to be emulated by the logic emulator 150. In one embodiment, the circuit design 190 includes a VHDL description of a circuit. In another embodiment, the circuit design 190 includes a Verilog description of a circuit. Importantly, the circuit design 190 includes any number of memory circuit designs 195. The memory circuit designs 195 can be of many different types.

For example, the memory circuit designs 195 can include simple RAM memory designs, multiported cache memory designs, EEPROMs and register files. The variety and number of memory designs that can be included in a circuit design 190 is a commercially important aspect of one embodiment of the invention. Designers can emulate more designs more easily than previous systems.

In one embodiment, the computer system 100 includes a workstation from Sun Microsystems, of Mountain View, Calif. In other embodiments, the computer system 100 includes other computers such as an IBM PC compatible, a workstation from Hewlet-Packard, Inc., a workstation from Silicon Graphics, Inc. In another embodiment, the computer system 100 and the logic emulator 150 are included in one computer system.

The logic emulator 150 emulates the functions of the circuit design 190. The logic emulator 150 is described in greater detail in U.S. patent application Ser. No. 08/ToBeCompleted. In one embodiment, the logic emulator 150 emulates the functions of the circuit design 190 using a technique called time slicing. Time slicing allows the logic emulator 150 to use multiple clock cycles to emulate a function performed in one clock cycle of the circuit design 190. The outputs from one emulator clock cycle are fed back into the emulation circuits to generate new outputs. The emulation circuits are reconfigured between emulator clock cycles, allowing the emulator 150 to emulate the functions of the circuit design 190.

The logic emulator 150 includes a number of processor boards 160. Each processor board 160 includes a number of integrated circuits 170 connected to a board interface 162 circuit. The integrated circuits 170 can exchange information across processor boards 160 and can therefore work together to emulate the circuit design 190. In one embodiment, one integrated circuit 170 can emulate multiple small memory designs and multiple integrated circuits 170 can emulate one large memory design.

The integrated circuit 170 includes a number of circuit blocks having the following interconnections. The inputs to the integrated circuit 170 are connected to a routing and logic block 172, a backplane selector 174 and the control and output circuits 171. The routing and logic block 172 and the backplane selectors 174 are connected to an output selector 176. The output of the output selector is connected to a register 178, a feedback selector 179, an emulation memory 180 and the output of the integrated circuit 170. The control and output circuits 171 are also connected to the output of the integrated circuit 170.

The control and output circuits 171 receive control signals from the integrated circuit 170 inputs. The control and output circuits 171 generate control signals to control the circuits within the integrated circuit 170. The control and output circuits 171 also include a programmable output memory for outputting programmed outputs.

The backplane selectors include thirty-two 32:1 selectors. This allows the integrated circuit 170 to select any of the thirty-two backplane inputs (from the board interface 162) in any order.

The routing and logic block 172 includes multiple groups of selectors, registers and programmable logic blocks. During an emulation of a circuit design 190, the routing and logic block 172 is continually programmed and reprogrammed while being fed inputs and feedback from its outputs. Thus, the routing and logic block 172 performs a large part of the emulation process. During an emulation, the routing and logic block 172 is programmed to generated addresses and data for the emulation memory 180.

The register 178 stores outputs from the output selector 176 for later use, (eg., for programmable pipelining).

The feedback selector 179 selects between a straight feedback from the output selector 176 or from the output of the register 178.

The emulation memory 180 enables the emulator 150 to emulate many different types of memory designs. The emulation memory 180 receives inputs from the output selector 176 and generates outputs that are fed back into the output selector 176.

b. An Emulation Memory

Figure 2:
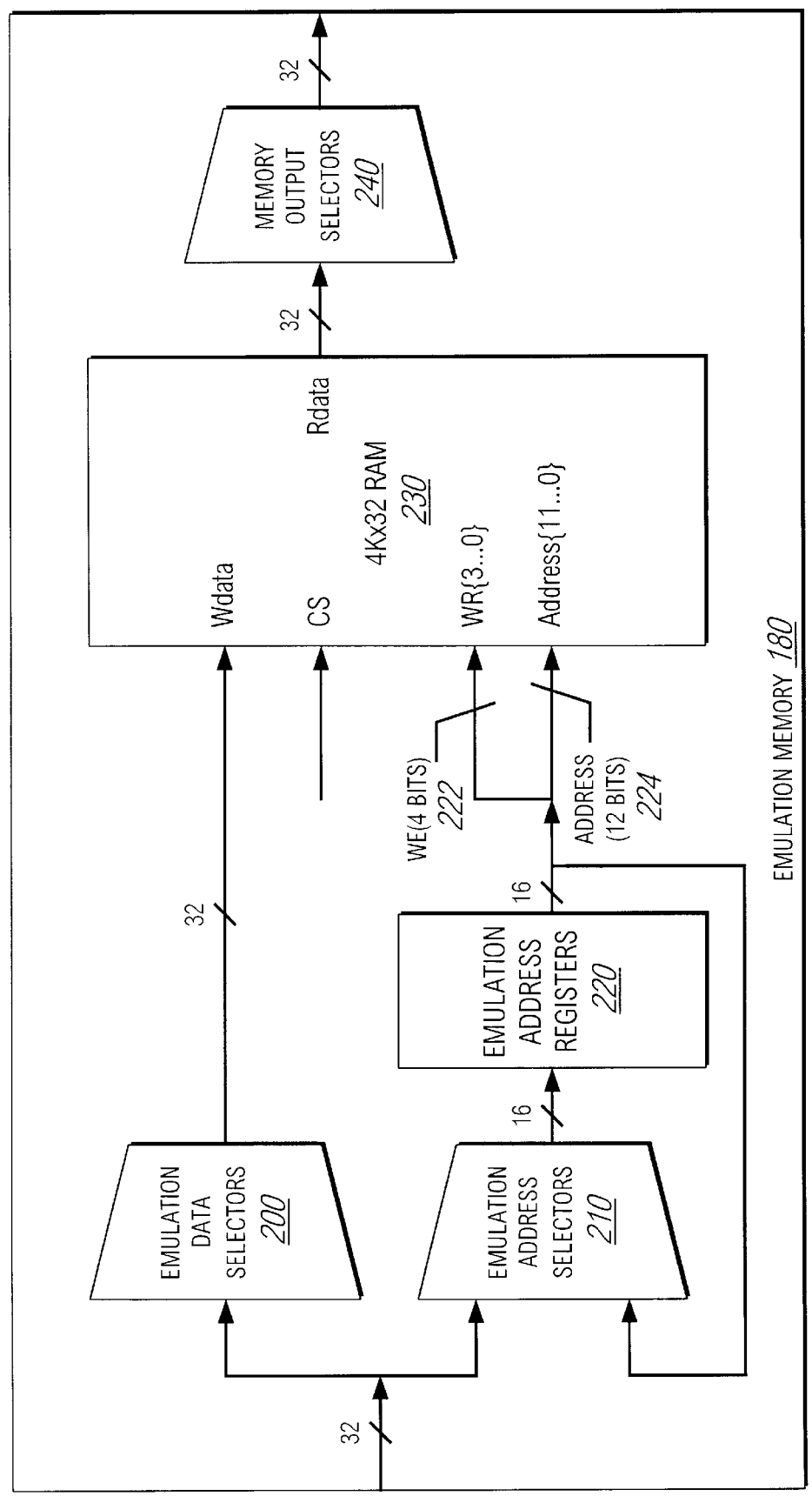
FIG. 2 illustrates an emulation memory circuit for use in the emulation system.

FIG. 2 illustrates one embodiment of the emulation memory 180 of FIG. 1. In one embodiment, the emulation memory 180 is integrated on the integrated circuit 170. In another embodiment, the emulation memory 180 is integrated on a separate integrated circuit or on multiple integrated circuits.

The emulation memory 180 includes the circuits having the following connections. The emulation data selectors 200 and the emulation address selectors are connected to the emulation memory 180 input. The output of the emulation data selectors 200 is coupled to the data input (thirty-two bit Wdata) of the 4K×32 RAM 230. The output of the emulation address selectors 210 is coupled to an emulation address register 220. The output of the emulation address registers 220 is coupled to the RAM 230 address (twelve bits) and write enable (four bits) inputs. The RAM 230 also has a chip select line. The output of the RAM 230 (thirty-two bit Rdata) is coupled to the memory output selectors 240. The output of the memory output selectors 240 is coupled to the output of the emulation memory 180.

The emulation data selectors include thirty-two 32:1 selectors. The thirty-two input lines come from the thirty-two bit wide input data bus of the emulation memory 180. The thirty-two 32:1 selectors allow the emulation data selectors 200 to connect any input line to any Wdata input. This provides flexibility in the system by allowing data for the RAM 230 to be generated on any of the thirty-two bit data lines.

The emulation address selectors 210 include sixteen 35:1 selectors. Each 35:1 selector has thirty-five input lines that include the thirty-two input lines of the emulation memory 180, a ground line, a VCC line, and a corresponding output line from the emulation address registers 220. For example, the 35:1 selector that outputs the address 224 bit seven for the emulation address registers 220 has the following inputs: bits 31–0 from the emulation memory 180 input bus, VCC, ground, and address 224 bit seven output by the emulation address registers 220. Thus, the emulation data selectors 200 select their output to be from the emulation memory's 180 input, feedback from the emulation address registers 220, set values (0 or 1 from the VCC and ground lines), or combinations of these lines.

The emulation address registers 220 store the output from the emulation address selectors 210. The output of the emulation address registers 220 includes a twelve bit address 224 and four write enable lines. The address 224 selects the address of one thirty-two bit entry in the RAM 230 while the four write enables 222 select which of the four bytes of the entry are to be written to. Thus, using the combination of the address 224 and the write enable 222, any byte in the RAM 230 can be selectively written to.

The emulation address registers 220 allow the emulation memory 180 to store an address over multiple time slices during an emulation. For example, assume that in a time slice only the least significant sixteen bits of a thirty-two bit data entry are generated by the routing and logic block 172. Assume also that the address for that entry is also generated. The emulation address registers 220 can store that address during the first time slice but only enable the two lowest bytes of an entry in the RAM 230. During the next time slice, the upper sixteen bits of information are generated by the routing and logic block 172. The same address is used but only the upper two bytes of the entry in the RAM 230 are enabled. Thus, the address does not need to be regenerated for multiple memory accesses to the same memory location.

The output of the RAM 230 (Rdata) is connected to the memory output selectors 240. The memory output selectors include thirty-two 32:1 multiplexors. The thirty-two 32:1 multiplexors allow any data line from the RAM 230 to be connected to any data line of the emulation memory's 180 output.

The emulation data selectors 200, the emulation address selectors 210, the emulation address registers 220, the selectors 240, and the chip select of the RAM 230, are all controlled by the control and output circuits 171.

The RAM 230 includes a 4K×32 static random access memory that has a read port and a write port. The RAM 230 is a write-through memory (if a value X is written during a clock cycle, the value X appears at the output of the RAM 230 during that clock cycle). In other embodiments, other types of memories are used in place and/or in addition to RAM 230, such as a 16K×64 EEPROM or a 1M×1 DRAM. In other embodiments, different types of memories replace the RAM 230 on different emulation memories 180 in different integrated circuits 170. Additionally, the RAM 230 need not be included on the integrated circuit 170. Thus, in one embodiment, the RAM 230 is of the integrated circuit 170. For these other types of memories, corresponding changes are made to the emulation data selectors 200, the emulation address selectors 210, the emulation address registers 220 and the memory output selectors 240.

c. An Embodiment of a Method of Emulating a Number of Memory Designs

Figure 3:
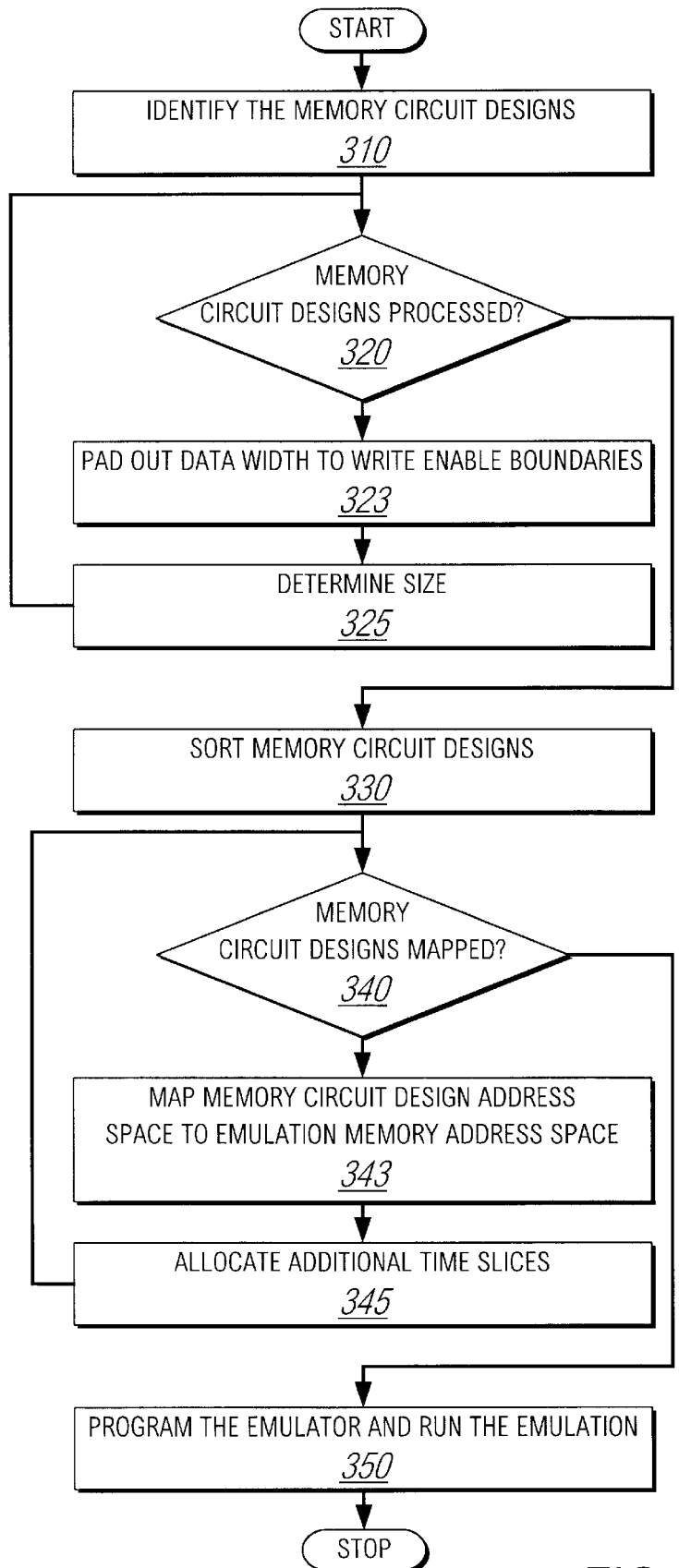
FIG. 3 illustrates an embodiment of a method of emulating a circuit design that includes memory circuit designs.

FIG. 3 illustrates one embodiment of a method of emulating a number of memory circuit designs 195. This embodiment can be implemented in the computer system 100 and the emulator 150. Generally, this embodiment maps the memory circuit designs 195 to one or more emulation memories 180. The mapping involves identifying the memory circuit designs 195 and determining an effective correlation between the memory circuit designs 195's address spaces and the address spaces of the emulation memories 180.

At block 310, the computer system 100 identifies the memory circuit designs 195 within the circuit design 190. This can be done by analyzing the behavioral description of the target circuit design. The computer system 100 identifies the width, in bits, and the height, in entries, of each memory circuit design. Thus, each memory circuit design is identified by the number of entries in the memory circuit design and the number of bits in each entry. Additionally, the number and types of ports for each memory circuit design are identified. For example, the computer system 100 can identify a memory circuit design as a dual ported RAM with 1K entries and thirty-two bit wide entries.

Next, at block 320, a test is made to determine whether all the memory types have been processed. If not, then block 323 and block 325 are executed.

At block 323, the width of each memory circuit design is padded out to the nearest write enable boundary of the RAM 230. For example, if a memory circuit design has entries only four bits wide, but the write enables for the RAM 230 are on eight bit boundaries, then the memory circuit design's width is increased to eight bits. This block, therefore, matches the minimum granularity of the RAM 230 to the width of the memory circuit design's entry. In the case of read only memories, padding is not necessary in all cases, since the output selectors 240 allow memory values to be accessed as individual bits.

Next, at block 325, the size, in bits, of each memory circuit design is determined. This is done by multiplying the padded width by the number of entries. For example, for the emulation memory 180 of FIG. 2, a 1K×32 memory circuit design has 32,768 bits, while a 1K×4 memory circuit design has 8,192 bits (1K×8—the width being padded out to eight).

After all the memory circuit designs have been processed, then at block 330, the memory circuit designs 195 are sorted by size. The largest memories are at the top of the sorted list.

Next, at block 340, the computer system 100 tests to determine whether all the memory circuit designs 195 have been mapped to the emulation memories 180. If not all the memory circuit designs 195 have been mapped then block 343 and block 345 are executed. Thus, block 343 and block 345 are executed for each of the memory circuit designs 195 beginning with the largest sized memory circuit design 195.

Figure 4:
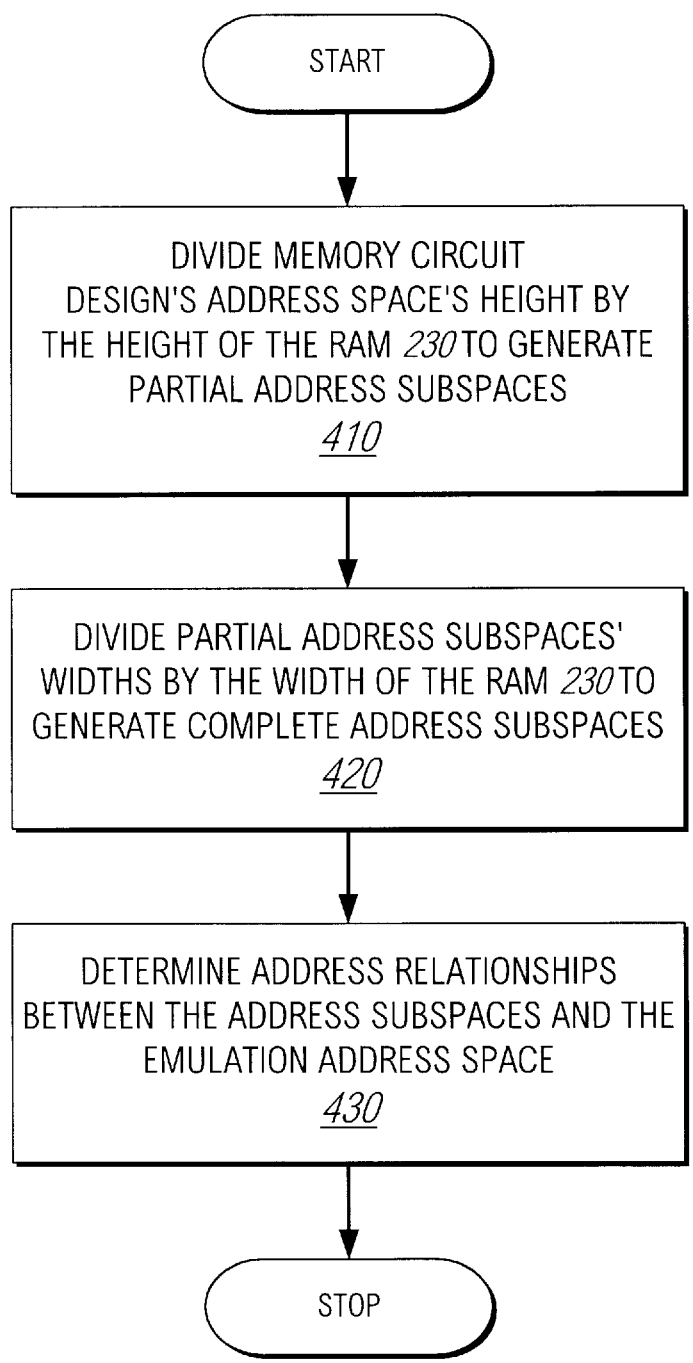
FIG. 4 illustrates an embodiment of a method of mapping memory circuit designs to the emulation memories.

At block 343, a particular memory circuit design's address space is mapped to the address space of the emulation memories 180. The address space of the emulation memories 180 is treated as one large memory space (a memory palette). Each memory circuit design is then allocated to a corresponding portion of the memory palette. FIG. 4 illustrates block 343.

At block 345, additional time slices are allocated for different subspaces if necessary. Ideally, all the memory circuit designs 195 directly map to a part of a RAM 230. However, additional time slices may be necessary where the memory circuit design is for a multiported memory. In the first time slice, the emulation memory 180 can emulate the access by the first port and in the second time slice, the emulation memory 180 can emulate the access by the second port. Thus, in one embodiment, the additional time slices are added for each port of the memory circuit design in excess of one.

Further additional time slices may be added for memory circuit designs 195 that are wider than the width of the RAM 230. For example, assume the memory circuit design is sixty-four bits wide, the RAM 230 is thirty-two bits wide. Further assume that the mapping block 343 creates two address subspaces to represent the address space of the memory circuit design. Further assume the two address subspaces are mapped to a single RAM 230 address space. Then, the low order thirty-two bits of an entry for the memory circuit design are written to the RAM 230 in the first time slice and the high order thirty-two bits of that entry are written to the RAM 230 in the second time slice.

Another reason to add additional time slices occurs where address spaces from different memories are mapped into the same RAM 230's address space and there is a conflict for access to the RAM 230. For example, if two memory circuit designs 195 map into the same RAM 230's address space, and the circuit design 190 defines that both of those memory circuit designs are to be accessed within the same cycle, then an additional time slice may be needed.

After all the memory circuit design 195 address spaces have been mapped to the emulation memories 180, at block 350, the emulator 150 is programmed by the computer system 100. This involves loading the control and output circuits 171 with the control programs. Part of the load includes the control signals to ensure that the routing and logic blocks 172, and the other components of the integrated circuits 170, provide the correct address and data information to the emulation memory 180 to map the memory circuit address spaces to the emulation memories 180's address space. Next, the emulation is executed. This includes providing the emulator 150 with the test vectors to exercise the circuit design 190.

FIG. 4 illustrates one embodiment of a method of mapping the memory circuit design to the emulation memory 180's address space.

At block 410, the memory circuit's address space is first divided by the height of the RAM 230 to generate one or more partial address subspaces. Block 410 solves the problem of fitting a memory circuit design having a height greater than the height of the RAM 230 into the emulation memory's 180 address space by distributing the memory circuit's address space across multiple RAMs 230.

At block 420, the partial address subspaces are then divided further, if necessary. The partial address subspaces created in block 410 are divided by the width of the RAM 230 to generate address subspaces. Thus, the block 410 solves the problem of fitting a memory circuit design having a width greater than the width of a RAM 230 into the emulation memory address space by distributing the memory circuit design's address space across multiple entries in the RAMs 230. The entries may be in one or more RAMs 230.

At block 430, the computer system 100 determines the relationship between the address subspaces and the emulation address space. This involves assigning a particular subspace to a particular part of a RAM 230 in the logic emulator.

d. Examples of Mapping Memory Designs to an Emulation Memory

Figure 5:
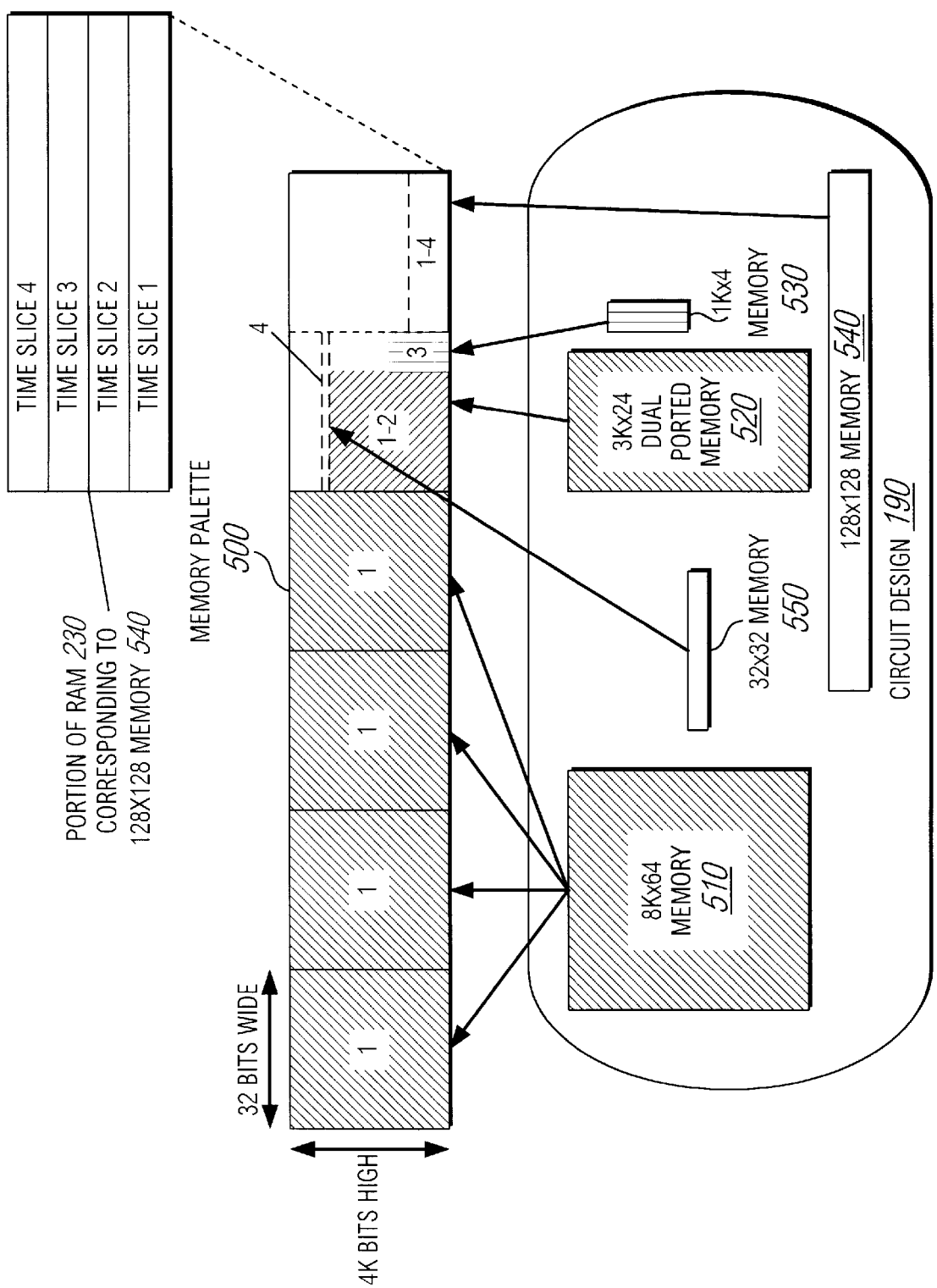
FIG. 5 illustrates an example of mapping memory circuit designs to an emulation memory address space.

FIG. 5 illustrates an example of a number of memories in a design being mapped to the emulation memories 180. Importantly, as noted above, the software tools treat the emulation memories' 180 address space as one large memory palette. The memory circuit designs 195 are mapped into that memory palette 500.

In this example, the circuit design 190 includes the following memory circuit designs 195: 8K×64 bit memory 510, a 3K×24 bit dual ported memory 520, a 4×256 bit memory 530, 128×128 memory 540 and a 32×32 bit memory 550. These memory circuit designs 195 are mapped to the memory palette 500 using the steps in FIG. 3.

For the purposes of this example, the memory palette 500 only represents an address space of six times 4K×32. In one system, the memory palette 500 includes much larger memory spaces. The memory pallette 500 includes illustrative 4K×32 bit boundaries that represent the physical address spaces of the RAMs 230.

Following the embodiments described in FIG. 3 and FIG. 4, the memory circuit designs 195 are mapped to the memory palette 500 as follows.

First, at block 310, all the memory circuit designs 195 are identified. Next, block 323 and block 345 are executed for each memory circuit design 195. Block 323 pads the 1K×4 memory 530 out to a 1K×8 memory 530 in this example where the write enable boundaries of the RAMs 230 are on byte boundaries. Thus, the following memories have the following sizes shown in Table 1.

TABLE 1

| Memory Circuit Design 195 | Size in Bits |
|---|---|
| 8K × 64 Memory 510 | 52488 |
| 32 × 32 Memory 550 | 1024 |
| 128 × 128 Memory 540 | 16382 |
| 3K × 24 Memory 520 | 73728 |
| 1K × 4 Memory 530 | 8192 |

Table 2 shows the sorted list of memory circuit designs 195 after executing block 330.

TABLE 2

| Memory Circuit Design 195 | Size in Bits |
|---|---|
| 8K × 64 Memory 510 | 524288 |
| 3K × 24 Memory 520 | 73728 |
| 128 × 128 Memory 540 | 16382 |
| 1K × 4 Memory 530 | 8192 |
| 32 × 32 Memory 550 | 1024 |

Next, each of the memory circuit designs 195 are mapped to the memory palette 500. At block 410, the 8K×64 memory's 510 address space is broken into two partial subspaces of 4K×64 each. At block 420, the two partial subspaces are further broken into complete subspaces of 4K×32 each. At block 430, these four complete subspaces are mapped to the memory palette 500's first available address spaces (the address spaces of the first four emulation memories 180). Block 410 and block 420 are executed for the 3K×24 memory 520 resulting in one address subspace of 3K×24. This address subspace is mapped, at block 430, to the next available part of the memory palette 500. Next, the 128×128 memory 540 is run through block 410 and block 420. Block 410 results in an 128×128 partial address subspace. Block 420 results in four 128×32 complete address subspaces. The computer system 100 then maps these subspaces to the next available space in the memory palette 500. Block 410 and block 420 are then executed for the 1K×4 memory 530 resulting in an address subspace of 1K×8. Because there is still room in the fifth emulation memory 180's address space, the 1K×8 address subspace is mapped to the space next to the 1K×24 address subspace. Next, the 32×32 memory 550 is run through block 410 and block 420. These are mapped to the next available areas of the memory palette 500.

Table 3 shows the results of block 345. After the mapping is done for a memory circuit design 195, then block 345 is executed. Table 3 illustrates the results of the time slice allocation.

In the time slice allocation, a number of conflicts result in additional time slices being required. A conflict arises where multiple ports on a memory circuit design exist (e.g., 3K×24 dual ported memory 520). A conflict also arises where multiple address subspaces for a memory circuit design are mapped into the same RAM 230 (e.g., 128×128 memory 540). Further, a conflict arises where two or more memory circuit designs 195 are to be written to, or read from, in the same clock cycle of the circuit design 190 (e.g., 3K×24 memory 520, 1K×4 memory 530 and 32×32 memory 550). Assume, for this example, every memory circuit design 195 is to be written to or read from in every clock cycle of the circuit design 190. In many circuit designs 190, this is not true and will not result in a conflict and therefore will not require multiple time slices to resolve.

TABLE 3

| Memory Circuit Design 195 | Address Space | Subspace | RAM 230 | Emulation Memory 180 Address Space | Time Slice |
|---|---|---|---|---|---|
| 8K × 64 Memory 510 | 1FFF-0: bits 63–0 | FFF-0: bits 31–0 | 0 | 0FFF-0: bits 31–0 | 1 |
| | | FFF-0: bits 63–32 | 1 | 0FFF-0: bits 31–0 | 1 |
| | | 1FFF-1000: bits 31–0 | 2 | 0FFF-0: bits 31–0 | 1 |
| | | 1FFF-1000: bits 63–32 | 3 | 0FFF-0: bits 31–0 | 1 |
| 3K × 24 Memory 520 | BFF-0: bits 23–0 | BFF-0: bits 23–0 | 4 | BFF-0: bits 23–0 | 1-Port 0 2-Port 1 |
| 128 × 128 Memory 540 | 7F-0: bits 127–0 | 7F-0: bits 31–0 | 5 | 7F-0: bits 31–0 | 1 |
| | | 7F-0: bits 63–32 | 5 | FF-80: bits 31–0 | 2 |
| | | 7F-0: bits 95–64 | 5 | 17F-100: bits 31–0 | 3 |
| | | 7F-0: bits 127–96 | 5 | 1FF-80: bits 31–0 | 4 |
| 1K × 4 Memory 530 | 3FF-0: bits 3–0 | 3FF-0: bits 7–0 | 4 | 3FF-0: bits 32–24 | 3 |
| 32 × 32 Memory 550 | 1F-0: bits 31–0 | 1F-0: bits 31–0 | 4 | C1F-C00: bits 31–0 | 4 |

Other embodiments have numerous improvements over the basic mapping algorithm described above. For example, in one embodiment, memory circuit designs 195 that are accessed in the same clock cycle of the circuit design 190 are mapped to different RAM 230s to avoid adding additional time slices. In another embodiment, the set of subspaces created from memory circuit designs 195 that are wider than thirty-two bits are mapped across multiple RAM 230s. This reduces the number of time slices needed at the expense of potentially duplicating work in the routing and logic block 172.

What is claimed is:

1. An emulation memory comprising:
   a memory circuit having an address port and a data port;
   an address circuit having an address output port coupled to said address port, said address circuit being programmable, said address circuit mapping a set of addresses of a plurality of target memories to a set of emulation memory addresses over a set of time periods, said set of target memories includes a first target memory of a first type and a second target memory of a second type, said first target memory and said second target memory for receiving addresses during a single cycle of a target design, and wherein said address circuit is for generating a first emulation address corresponding to a first target memory address during a first cycle of said emulation memory, and a second target memory address corresponding to a second target memory address during a second cycle of said emulation memory.

2. An emulation memory comprising:
   a memory circuit having an address port and a data port:
   an address circuit having an address output port coupled to said address port, said address circuit being programmable, said address circuit mapping a set of addresses of a plurality of target memories to a set of emulation memory addresses over a set of time periods, said emulation memory further including a first memory circuit and a second memory circuit, each memory circuit for storing an N words of data, and wherein said set of target memories includes a first target memory design for storing a M words of data, where M is greater than N, and wherein said address circuit includes a first address circuit for generating a first set of emulation addresses for said first memory corresponding to N words of data of said M words of data, and wherein said address circuit includes a second address circuit for generating a set of second emulation addresses for said second memory corresponding to M–N words of data of said M words of data.

3. The emulation memory of claim 2 wherein N is 4096 and M is 6144 and said first set of emulation addresses correspond to word zero through word 4095 of said M words of data and where said second set of emulation addresses correspond to word 4096 through word 6143.

4. An emulation memory comprising:
   a memory circuit having an address port and a data port;
   an address circuit having an address output port coupled to said address port, said address circuit being programmable, said address circuit mapping a set of addresses of a plurality of target memories to a set of emulation memory addresses over a set of time periods;
   a first memory circuit for storing an N bit wide data word, and wherein said set of target memories includes a first target memory design for storing a M bit wide data word, where M is greater than N, and wherein said address circuit includes a first address circuit for generating a first emulation address for said first memory corresponding to N bits of said M bit wide data word, and wherein said first address circuit is for generating a second emulation address for said first memory circuit corresponding to M–N bits of said M bit wide data word.

5. The emulation memory of claim 4 wherein N is thirty-two and M is sixty-four.

6. a method of emulating a set of memory designs in an emulator, said emulator including an address circuit and a memory circuit, said memory circuit includes a set of emulation memories, each emulation memory being N bits in size, and wherein a first memory design being M bits in size, M being greater than N said method comprising:
   mapping each memory design to an address space in said memory circuit and to a set of time slices, said set of time slices corresponding to a cycle in said each memory design, said mapping step further comprising:
   mapping N low order bits of said first memory design to a first emulation memory;
   mapping M–N high order bits of said first memory design to a second emulation memory;
   responsive to receiving a memory design function command, performing the following, generating a set of memory addresses in said address space over a corresponding set of time slices; and
   performing a set of memory functions on said memory circuit over said corresponding set of time slices and using said set of memory addresses, said set of memory functions emulation said memory design function.

7. The method of claim 6 wherein N is 131,072 bits.

8. A method of emulating a set of memory designs in an emulator, said emulator including an address circuit and a memory circuit, said memory circuit includes an emulation memory having a 32 bit word and wherein a first memory design having a 64 bit wide word said method comprising:
   mapping each memory design to an address space in said memory circuit and to a set of time slices, said set of time slices corresponding to a cycle in said each memory design, said mapping step further comprises:

mapping bits 31–0 of said 64 bit wide word to a first word of a first pair of words in said emulation memory; and mapping bits 63–32 of said 64 bit wide word to a second word of said first pair of words;

responsive to receiving a memory design function command, performing the following, generating a set of memory addresses in said address space over a corresponding set of time slices; and performing a set of memory functions on said memory circuit over said corresponding set of time slices and using said set of memory addresses, said set of memory functions emulating said memory design function.

\* \* \* \* \*